United States Patent [19]

Thompson et al.

[11] Patent Number: 5,748,451
[45] Date of Patent: May 5, 1998

[54] POWER DISTRIBUTION/STIFFENER FOR ACTIVE BACK PLANE TECHNOLOGIES

[75] Inventors: Gary Allen Thompson, Pine Island; Charles Vernon Zenz, Sr., Rochester, both of Minn.

[73] Assignee: International Business Machines Corporation, Armonk, N.Y.

[21] Appl. No.: 696,669

[22] Filed: Aug. 14, 1996

[51] Int. Cl.⁶ ............................ H01R 23/70; H01R 9/09; H01R 4/66; H05K 1/11

[52] U.S. Cl. ............... 361/788; 361/775; 361/790; 361/803; 361/804; 361/794; 439/61; 439/97

[58] Field of Search ................ 174/72 B, 71 B, 174/88 B, 99 B; 211/41.1, 26; 361/679, 683, 686, 733, 752, 753, 775, 788, 790, 791, 794, 796, 799, 800, 803, 804, 807, 809, 810, 816, 818, 825, 829, 830; 439/55, 61, 92, 95, 97, 101, 109; 364/708.1

[56] References Cited

U.S. PATENT DOCUMENTS

| | | |
|---|---|---|
| 3,992,686 | 11/1976 | Canning . |
| 4,158,220 | 6/1979 | Yamamoto et al. ............... 361/775 |
| 4,241,381 | 12/1980 | Cobaugh et al. .................. 361/775 |
| 4,450,029 | 5/1984 | Holbert et al. .................... 174/255 |
| 4,717,344 | 1/1988 | Schempp et al. ................. 439/61 |
| 4,719,541 | 1/1988 | Ono et al. ......................... 361/775 |
| 4,755,145 | 7/1988 | Johnson et al. ................... 439/61 |
| 4,862,326 | 8/1989 | Blomstedt et al. ................ 361/796 |
| 5,023,754 | 6/1991 | Aug et al. . |
| 5,136,470 | 8/1992 | Sheridon et al. . |
| 5,162,977 | 11/1992 | Paurus et al. . |
| 5,185,502 | 2/1993 | Shepherd et al. . |
| 5,233,677 | 8/1993 | Winslow . |
| 5,287,244 | 2/1994 | Hileman et al. .................. 364/708.1 |
| 5,390,081 | 2/1995 | St. Pierre . |
| 5,528,464 | 6/1996 | Hamaguchi et al. .............. 361/752 |
| 5,617,299 | 4/1997 | Knoop et al. ..................... 361/788 |
| 5,659,245 | 8/1997 | Ping et al. ........................ 324/158.1 |

FOREIGN PATENT DOCUMENTS 59-47621  3/1984  Japan ........................... 361/775

*Primary Examiner*—Donald Sparks
*Attorney, Agent, or Firm*—Michael F. Hoffman

[57] ABSTRACT

Disclosed is a backplane assembly that includes stiffeners to provide both mechanical stiffening and electrical power distribution. In particular, the present invention provides a power distribution system that comprises a backplane, a power stiffener having alternate layers of dielectrics and conductors proximately located to the backplane, and removable connection to electrically connect the conductors in the stiffener to the backplane. Because power can be transferred directly to the backplane from the stiffener via the connection, the need for power cables and bus bars on the backplane is eliminated. In addition, noise suppressing capacitors may be located on the power stiffener, close to the load source.

29 Claims, 3 Drawing Sheets

POWER DISTRIBUTION/STIFFENER FOR ACTIVE BACK PLANE TECHNOLOGIES

BACKGROUND

1. Technical Field

This invention relates to power distribution for electrical systems, and more specifically relates to back plane assemblies for integrated circuits.

2. Related Art

Active backplanes, or mother boards, provide the backbone that drive most computer systems. Backplanes, which generally exist in the form of a printed circuit board (PCB), may contain any number of logic, memory, or microprocessor devices. Backplanes may also contain interface mechanisms, such as receiving slots where additional cards and components can be plugged in. Recent advances in PCB manufacturing techniques, which include thinner etching processes, have allowed an increasing numbers of components, capable of performing at ever-increasing levels of performance, to be mounted on today's circuit boards. Thus, most backplanes used in large computers and control equipment now feature PCB's with extremely fine land (wire) widths, very thin copper layering, a minimal board thickness, and a high density of components.

While continuing advances in printed circuit board technology provide greater digital processing power, new challenges have been created in the area of interfacing high technology active backplanes with other computer system components. In particular, the delicate nature of today's active backplanes require a reliable mechanical support system and an efficacious means for supplying electrical power to all of the components that the board supports. Unfortunately, as printed circuit boards continue to become more densely populated with components, providing a power interface solution for active backplanes has become more difficult.

As noted, one of the primary problems involves the difficulty in delivering high power to the backplane and any cards and modules mounted thereto. Because high technology PCB's utilize extremely thin copper layering as their means for transferring power, it is difficult to provide high power across the large area that make up today's backplanes. Most existing systems are therefore forced to use bus bars or external cables to power the backplane. However, because of the relatively fragile nature of most backplanes, it is not particularly desirable to add any unnecessary strain (in the form of cabling, etc.) to the backplane. While it is known to use stiffening mechanisms to help support the backplane, cables and bus bars still create an extremely cumbersome method of supplying power to backplane.

In addition, because there exists limited room on the high technology circuit boards of today, it is impossible to mount relatively large noise suppressing capacitors directly on the backplane. Although it is ideal to have such devices at the load source (i.e., on or near the backplane loads), existing systems often require that capacitors be located in other areas within the computer system where space permits. Since the effect of such capacitors diminish as they are located further away from the load source, the inability to properly locate noise suppressing capacitors is another deficiency caused by advances in circuit board technology.

While various efforts have been made to address some of these issues, no known art addresses them all in a comprehensive and cost efficient manner. Therefore, without an improved backplane system that addresses each of the aforementioned problems, the full potential of the ongoing advances in circuit board technology will go unexploited.

SUMMARY OF THE INVENTION

The present invention provides a backplane assembly capable of addressing all of the problems identified with regard to today's high technology circuit boards. This is accomplished generally by mating the high technology circuit boards of today with lower technology power distribution systems in a back plane/stiffener relationship. In particular, the present invention provides a power distribution system that comprises a backplane, a stiffener having alternate layers of dielectrics and conductors (referred to as a power stiffener) proximately located to the backplane, and removable connection means to electrically connect the conductors in the stiffener to the backplane.

In a preferred embodiment, the assembly may include a second stiffener located on an opposite side of said backplane. The stiffeners may be mounted flush or be spaced from the backplane. In addition, one or both of the stiffeners may include cutouts, or slots for receiving cards that plug into the backplane. Additionally, one or both stiffeners may include means for receiving an external power cable or a regulator card that will in turn deliver power or electrical signals to the backplane via the conductors within the stiffener. Finally, the stiffeners may include capacitor mounting sites for receiving noise suppressing capacitors.

It is therefore an advantage of the present invention to provide a stiffener that can be used to distribute regulated power to an active backplane.

It is therefore a further advantage of the present invention to provide a simplified manufacturing system by combining a power distribution backplane, a stiffener and decoupling means in one unit.

It is therefore a further advantage of the present invention to reduce cabling or bus bars to the backplane.

It is therefore a further advantage of the present invention to provide means for plugging in power cables and regulators into a stiffener.

It is therefore a further advantage of the present invention to provide means for adding decoupling capacitors to the stiffener to provide noise reduction at the load source.

It is therefore a further advantage of the present invention to provide flexibility in designing a customized power system for feeding the power stiffener.

It is therefore a further advantage of the present invention to provide flexibility in designing a customized backplane assembly.

DETAILED DESCRIPTION OF THE PREFERRED EMBODIMENT

Figure 1:
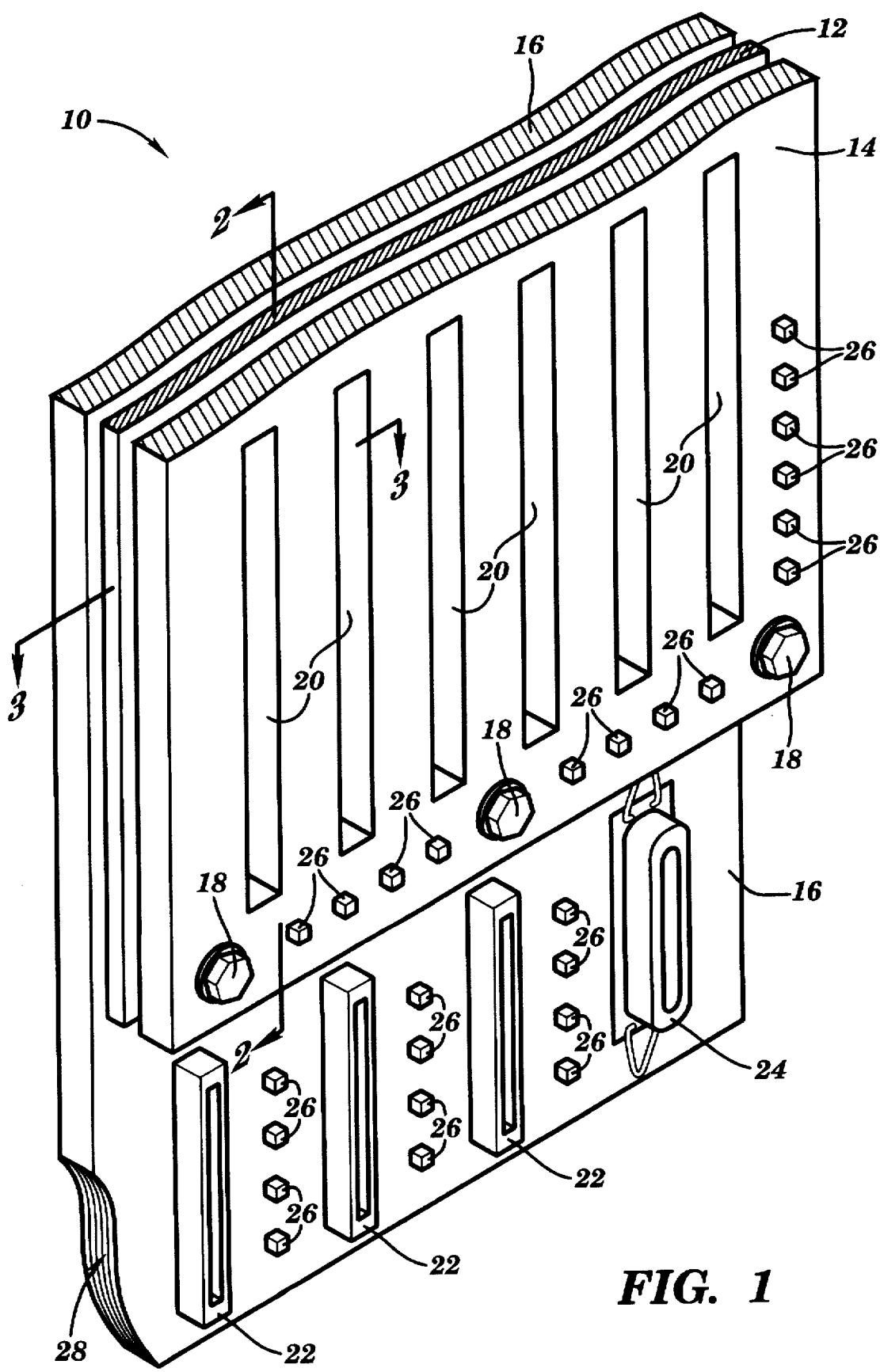
FIG. 1 depicts an isometric view of a backplane assembly in accordance to the present invention.

Referring now to the figures, FIG. 1 depicts a backplane assembly 10 in accordance with a preferred embodiment of the present invention. Backplane assembly 10 includes an active backplane 12, first stiffener 14, and second stiffener 16. Active backplane 12 may include a state of the art backplane design that utilizes relatively thin copper layers, an increased number of interconnect layers, finer line widths, and a relatively high number of components on the circuit board. Stiffeners 14 and 16 are oriented in a substantially coplanar manner to backplane 12 and are connected thereto by connection means 18.

Stiffener 16, which includes alternating layers of dielectric and conductive material 28, is referred to as a power stiffener. The conductive layers provide a means by which power and other electrical signals can be routed through stiffener 16 and readily delivered to active backplane 12. Stiffener 16 may include various coupling devices 22, 24 that will allow power and other electrical signals to be delivered thereto. One possible connection type for delivering power to the stiffener 16 may include edge card connectors 22 for receiving regulator cards. Alternatively, a standard type power supply cable may be plugged into coupling device 24. Any combination of these devices may be used as required, and there placement on stiffener 16 may be at any location where space permits. In addition, because there is ample space available on stiffener 16, one or more decoupling capacitors 26 may be readily mounted thereto on either side. Because of the limited space and lack of structural integrity associated with a typical active backplane 12, the ability to put these devices onto the stiffener 16 provides a significant advantage over that which presently exists in the art today.

Also shown in FIG. 1 is stiffener 14. Stiffener 14 includes slots 20 that allow circuit cards to pass through and plug into active backplane 12. It should be recognized that these slots may be of any dimension, depth or size suitable for handling plug-in cards or other devices. Depending on the design requirements of the particular system, stiffener 14 may or may not include an internal power distribution system similar to that found in a power stiffener 16. In a situation where stiffener 14 does not include an internal power distribution system, it still acts both as a stiffening means and as a ground plane and provides significant EMC shielding.

As noted, connection means 18 provide not only the mechanical connection between stiffeners 14 and 16 and active backplane 12, but also provide the necessary electrical conduction between the stiffeners and the backplane 12. Connection means 18 may include a bolt and nut arrangement such that the mechanical connection is removable, and may include any other conduction means, such as soldering, to allow for proper electrical connection.

It is understood that FIG. 1 depicts one of many possible embodiments that incorporate the invention as generally described herein. For instance, the assembly 10, may include only one power stiffener (e.g. 16), may be of any size or shape to suit the needs of the particular computer system, may have card slots that exist on both stiffeners, and may include any type of connection means that will provide electrical connection while also providing mechanical stability. In addition, the stiffeners may be spaced from the active backplane, or be mounted flush thereto. Finally, with regard to power stiffener 16, any arrangement of conductive layering or circuitry therein to provide significant powering may be utilized.

Figure 2:
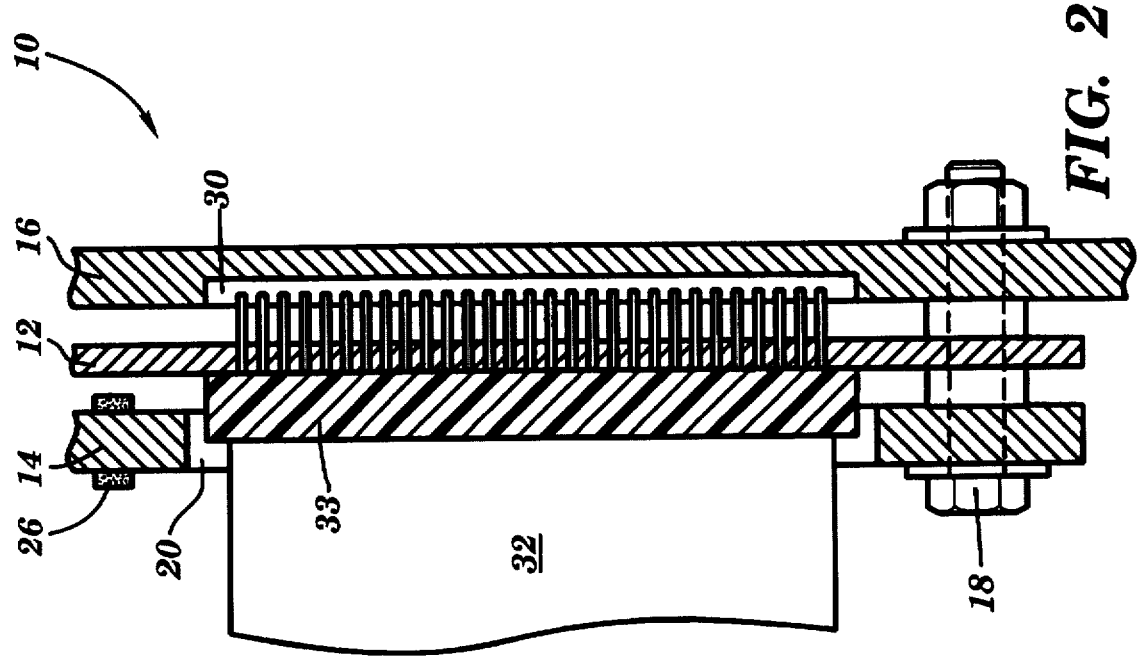
FIG. 2 depicts a cross-sectional side view of a backplane assembly in accordance with the present invention.

Referring now to FIG. 2, a side view of backplane assembly 10 is shown. Shown are stiffener 14, stiffener 16, active backplane 12 and connection devices 18. Also shown is a circuit card 32 which is inserted through a slot 20 in stiffener 14, plugged into active backplane 12 and further inserted into stiffener 16. It can be seen that stiffener 16 provides relief for circuit card connector 33 by providing a pocket 30 in which circuit card connector 33 may rest. Active backplane 12 may include a receiving means 33 which extends partially into slot 20 for holding card 32.

Figure 3:
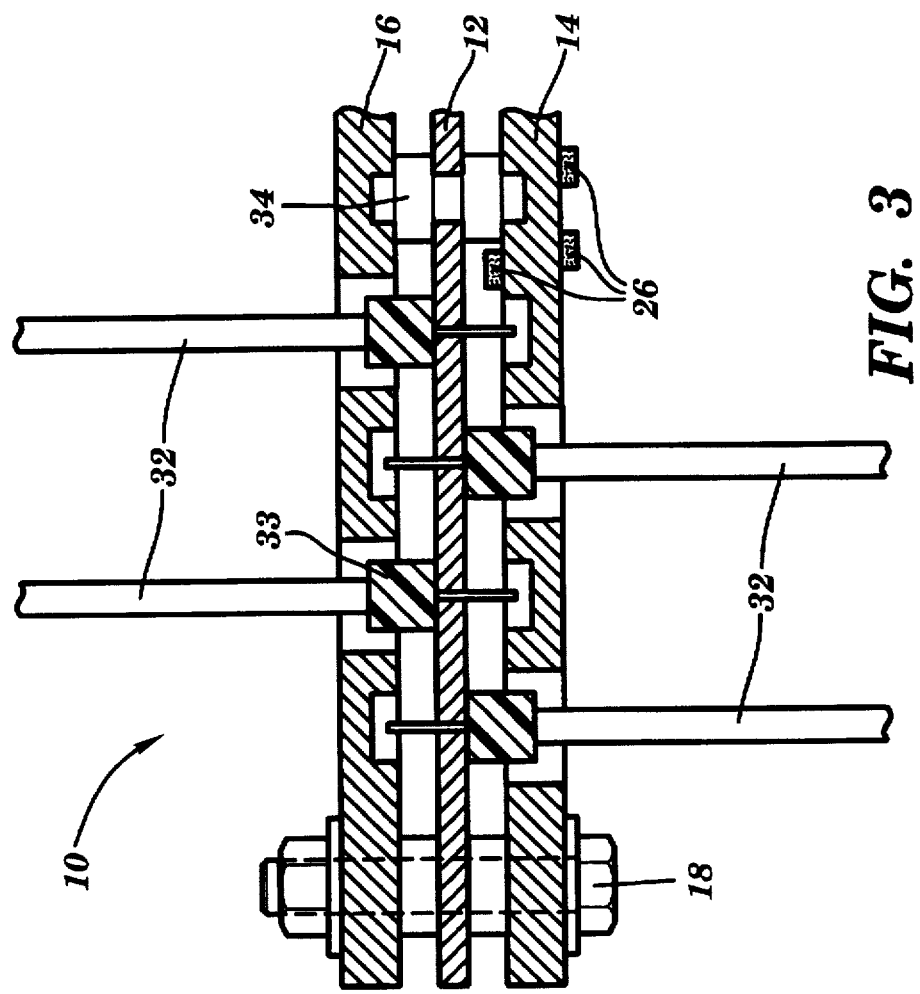
FIG. 3 depicts a top view of a backplane assembly in accordance with the present invention.

Referring now to FIG. 3, a top view of a backplane assembly 10 is shown. From the top view it can be seen that circuit cards 32 may be inserted through either side of power stiffeners 14 and 16 for insertion into active backplane 12. The configuration shown in FIG. 3 illustrates the flexibility of designing a backplane system using this invention that will meet the needs of the particular system being developed. Here, the four circuit cards 32 are plugged into active backplane 12 in an alternating arrangement. (I.e., the first one through stiffener 16, the second one through stiffener 14, the third one through stiffener 16, etc.) In this configuration it can be seen that both stiffeners 14 and 16 will have open slots 20 that allow for complete passage of a circuit card through the front stiffener, and pockets 30 that provide strain relief for the circuit card in the back stiffener. Finally, it can also be seen in FIG. 3 that various connection devices 18 and 34 may be utilized. In this case, connection device 34 illustrates an alternate connection means that does not include a screw or bolt that continues all the way through both stiffeners. Rather, the connection device 34 as shown is a non-electrical spacer or connector pair that provides additional mechanical support.

Figure 4:
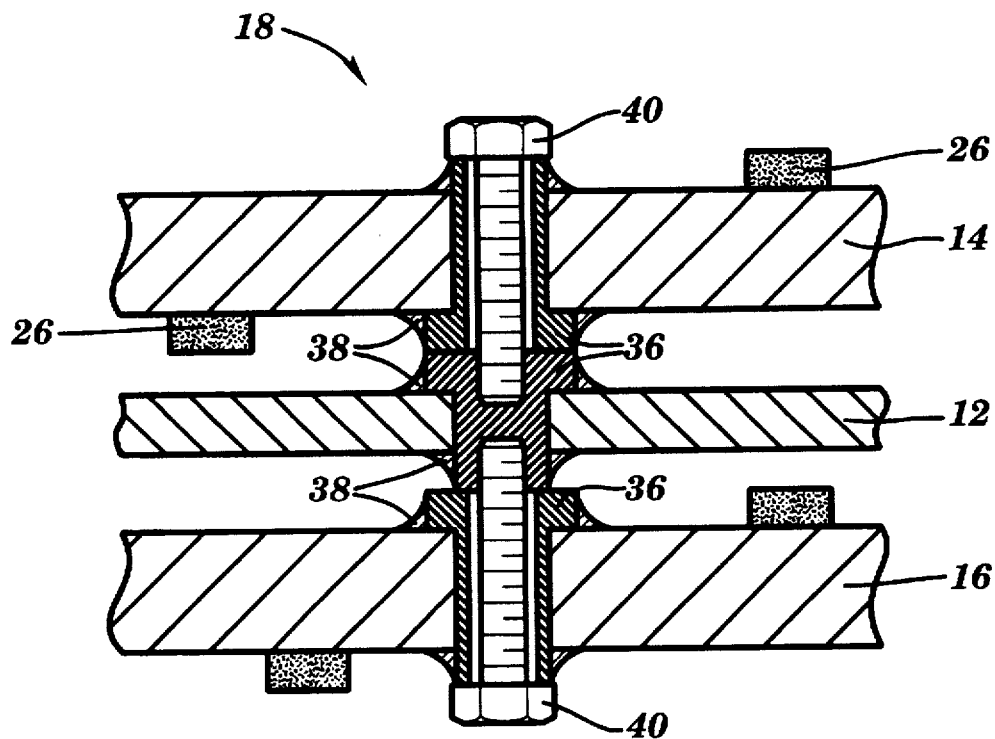
FIG. 4 depicts cross sectional side view of a connection means in accordance with the present invention.
Figure 5:
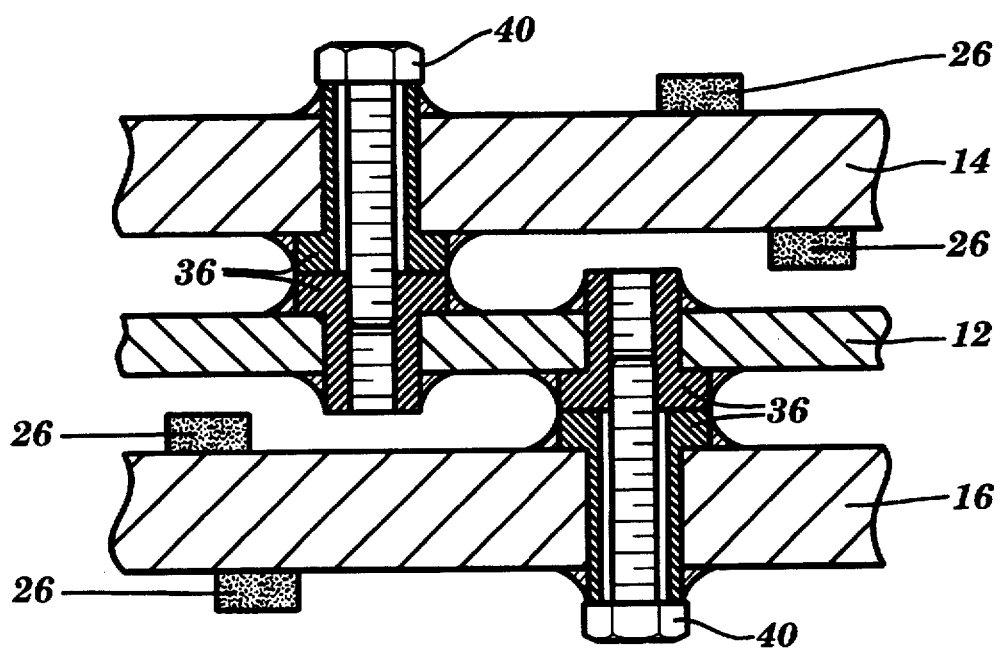
FIG. 5 depicts an alternate embodiment of a connection means in accordance with the present invention.

Referring now to FIGS. 4 and 5, various other connection means are shown that provide both mechanical and electrical connection between stiffeners 14 and 16 and active backplane 12. Shown are various methods of using t-shaped grommets 36 for providing interconnection. Grommets 36 may or may not be threaded. Additionally, solder 38 may be added to provide additional mechanical rigidness and/or electrical conductivity. While the connection means shown in FIGS. 1–5 disclose a few possible devices for interconnecting stiffeners and active backplanes, it should be recognized that any connection device that is capable of providing mechanical as well as electrical connection can be used within the purview of this invention. Other examples include screws, bolts, nuts, rivets, clamping systems, quick-release devices, and snap-on devices. It should also be recognized that the arrangement of any of the elements that make up this invention, including circuit card placement, capacitor location, stiffener location and size, power connection devices, strain relief pockets, connection devices, and overall size and shape, may be changed or modified as required to meet the specific needs of a particular application.

The embodiments and examples set forth herein were presented in order to best explain the present invention and its practical application and to thereby enable those skilled in the art to make and use the invention. However, those skilled in the art will recognize that the foregoing description and examples have been presented for the purposes of illustration and example only. The description as set forth is not intended to be exhaustive or to let it be invention to the precise form disclosed. Many modifications or variations are possible in light of the above teaching without departing from the spirit and scope of the following claims.

We claim:

1. A computer system having an electronic enclosure, said electronic enclosure including a power distribution system comprising:

an active backplane;

a stiffener proximate to said active backplane, said stiffener having alternate layers of dielectrics and conductors; and removable connection means to electrically connect the conductors in the stiffener to the active backplane.

2. The computer system of claim 1 wherein said power distribution system includes a pair of stiffeners arranged on either side of said active backplane to form a sandwich.

3. The computer system of claim 1 wherein said stiffener is spatially separated from said active backplane.

4. The computer system of claim 1 wherein said stiffener is mounted flush to said active backplane.

5. The computer system of claim 1 wherein said stiffener includes an open slot for inserting a card suitable for connection into said active backplane.

6. The computer system of claim 1 wherein said stiffener includes means for receiving an external connection.

7. The computer system of claim 6 wherein said external connection is a power connector cabled to a power supply.

8. The computer system of claim 6 wherein said external connection is an edge card connector for receiving a regulator card.

9. The computer system of claim 1 wherein said stiffener includes at least one capacitor mounting site.

10. The computer system of claim 1 wherein said removable connection means includes a screw.

11. A power distribution system comprising:

a backplane having a first and second planar face;

a first stiffener affixed in a substantially coplanar manner to said first planar face of said backplane, said stiffener having alternate layers of dielectrics and conductors; and conductor means for electrically connecting the conductors in said first stiffener to said backplane.

12. The power distribution system of claim 11 further comprising a second stiffener affixed in a substantially coplanar manner to said second planar face of said backplane.

13. The power distribution system of claim 11 wherein said conductor means is incorporated into a connection mechanism that connects said first stiffener to said backplane.

14. The power distribution system of claim 13 wherein said connection mechanism includes a screw.

15. The power distribution system of claim 11 wherein said stiffener includes an open slot for inserting a card connectable to said backplane.

16. The power distribution of claim 11 wherein said stiffener includes means for receiving an external connection.

17. The power distribution system of claim 16 wherein said external connection is a power connector cabled to a power supply.

18. The power distribution system of claim 16 wherein said external connection is an edge card connector for receiving a regulator card.

19. The power distribution system of claim 16 wherein said conductor means is removable.

20. A backplane stiffener system mountable to an active backplane, comprising:

a power stiffener having an internal power distribution system; and a connection device connecting said power stiffener to said active backplane wherein said connection device provides electrical conduction from said power stiffener to said active backplane.

21. The backplane stiffener system of claim 20 wherein said internal power distribution system includes alternating layers of dielectrics and conductors.

22. The backplane stiffener system of claim 20 wherein said connection device includes a bolt or screw.

23. The backplane stiffener system of claim 20 wherein said connection device includes conductive solder.

24. The backplane stiffener system of claim 20 wherein said power stiffener includes coupling means for receiving an external power supply.

25. The backplane stiffener system of claim 20 wherein said power stiffener includes at least one slot for holding at least one card.

26. The backplane stiffener system of claim 20 wherein said connection device includes a screw.

27. A backplane assembly for an electrical system comprising:

an active backplane;

a first stiffener located coplanar to a first side of said active backplane, said stiffener having alternating layers of dielectrics and conductors;

a second stiffener located coplanar to a second side of said active backplane, said stiffener having access holes for receiving a card mountable into said active backplane; and removable connection means to electrically connect the conductors in said first stiffener to the active backplane.

28. The backplane assembly of claim 27 wherein said first stiffener includes means for receiving a capacitor.

29. The backplane assembly of claim 27 wherein said removable connection means includes a bolt.

* * * * *